(12) United States Patent
Bach

(10) Patent No.: US 12,292,312 B2
(45) Date of Patent: May 6, 2025

(54) AUTOMATIC MEASUREMENT LOCATION IDENTIFICATION OF A LOGGER

(71) Applicant: Teste SE & Co. KGaA, Titisee-Neustadt (DE)

(72) Inventor: Sebastian Bach, Breitnau (DE)

(73) Assignee: Testo SE & Co. KGaA, Titisee-Neustadt (DE)

( * ) Notice: Subject to any disclaimer, the term of this patent is extended or adjusted under 35 U.S.C. 154(b) by 115 days.

(21) Appl. No.: 18/194,945

(22) Filed: Apr. 3, 2023

(65) Prior Publication Data

US 2023/0324201 A1 Oct. 12, 2023

(30) Foreign Application Priority Data

Apr. 6, 2022 (DE) .......................... 102022108279.2

(51) Int. Cl.
*G01D 5/14* (2006.01)
(52) U.S. Cl.
CPC .................... *G01D 5/145* (2013.01)
(58) Field of Classification Search
CPC ........ G01D 5/145; G01D 21/00; G01D 9/005; G01D 11/30; H03K 17/951; H03K 17/97
USPC ...................................................... 324/207.2
See application file for complete search history.

(56) References Cited

U.S. PATENT DOCUMENTS

| | | | | |
|---|---|---|---|---|
| 2009/0115404 A1* | 5/2009 | Peterson | ................ | G01D 5/145 324/207.2 |
| 2011/0115480 A1* | 5/2011 | Babin | ................... | G01D 5/145 324/207.25 |
| 2014/0208877 A1* | 7/2014 | Speck | ................ | G01B 21/047 73/866.5 |
| 2016/0324442 A1 | 11/2016 | Zdeblick | | |
| 2019/0094314 A1* | 3/2019 | Korolev | ............... | G01R 33/072 |

FOREIGN PATENT DOCUMENTS

| | | |
|---|---|---|
| DE | 102019202283 | 8/2020 |
| DE | 102020110429 | 10/2021 |
| KR | 1020210104172 | 8/2021 |
| WO | 2023084201 | 5/2023 |

* cited by examiner

*Primary Examiner* — Christopher P McAndrew
(74) *Attorney, Agent, or Firm* — Volpe Koenig

(57) ABSTRACT

A sensor kit (11) having a sensor unit (2) and at least one sensor unit retention member (1). A magnetically active region (5) is formed on the sensor unit retention member (1) and the sensor unit (2) has a magnetic field sensor (6). A relative position of the magnetically active region (5) with respect to the sensor unit (2) can be established based in detecting the magnetically active region (5).

11 Claims, 1 Drawing Sheet

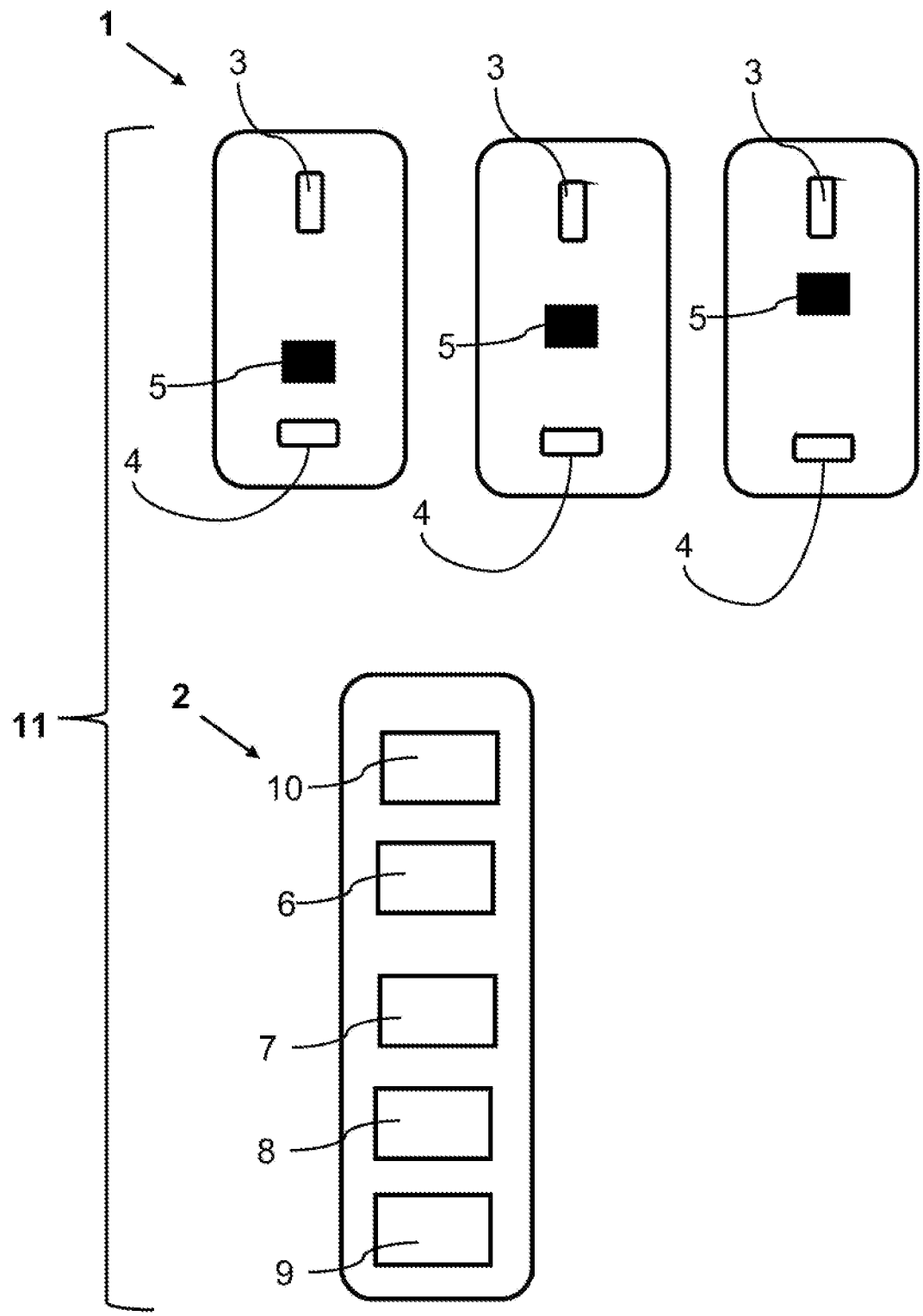

AUTOMATIC MEASUREMENT LOCATION IDENTIFICATION OF A LOGGER

CROSS-REFERENCE TO RELATED APPLICATIONS

This application claims priority to German Patent Application No. 10 2022 108 279.2, filed Apr. 6, 2022, which is incorporated herein by reference as if fully set forth.

TECHNICAL FIELD

The invention relates to a sensor kit having a sensor unit and at least one sensor unit retention member. Such a sensor kit has many applications in practice.

The invention further relates to a method for recording measurement values, wherein a sensor unit is secured to a sensor unit retention member and measurement values are detected in an automatically recurring manner. Such a method is known in practice.

SUMMARY

An object of the invention is to improve the operating properties of sensor kits and to configure the measurements which are carried out more precisely. The object is achieved using one or more of the features disclosed herein. Advantageous embodiments are described below and in the claims.

It should be noted that the features set out individually in the dependent claims can be combined with each other in any technologically advantageous manner and define other embodiments of the invention. Furthermore, the features set out in the claims are set out and described in greater detail in the description, wherein further preferred embodiments of the invention are set out.

In order to achieve the objective set out, the invention proposes one or more of the flowing features. In particular according to the invention it is consequently proposed with a sensor kit of the type described in the introduction in order to achieve the objective mentioned that a magnetically active region be formed on the sensor unit retention member and that the sensor unit have a magnetic field sensor by means of which a relative position of the magnetically active region with respect to the sensor unit can be established. Preferably, the relative position is a measurement location. In a particularly preferred manner, the relative position is a position in a measurement environment. Consequently, the relative position can be determined in a precise and reliable and automatic manner and requires no manual input of a user.

Advantageous embodiments of the invention which alone or in combination with the features of other embodiments can optionally be combined together with one or more of the features noted above will be described below.

In order to ensure an association of measurement values and the linked verification of the limit values, the measurement location, for example, a refrigerator, a cool box or a dishwasher, must be known. In the prior art, it is the case that in stationary applications, this is carried out manually during start-up by means of an input of a user. The measurement location is consequently input manually. However, this is very complex and error-prone and leads to imprecisions in the measurement location identification.

The present invention addresses this problem in this case and is intended to provide an improvement. The invention can be used particularly in dynamic applications with temporary monitoring, such as, for example, transport, application in dishwashers or in a "cook and chill" method where the measurement location very often changes and a manual adjustment of the measurement location can no longer be carried out in an efficient and reliable manner.

The invention ensures that an automatic and consequently reliable association of measurement values with the measurement location can take place under changing conditions.

In an advantageous embodiment, there may be provision for the sensor unit retention member to be configured to receive the sensor unit in a defined position and/or orientation. Consequently, the sensor unit can be moved into the vicinity of the sensor unit retention member and information items, for example, location information, can be exchanged between both objects.

The sensor unit may be in the form of a logger.

In an advantageous embodiment, there may be provision for the magnetic field sensor to be in the form of a Hall sensor. Consequently, a cost-effective and reliably measuring element can be provided. The Hall sensor can read a location information or a position indication which is stored in the magnetically active region or which is predetermined by the position of a permanent magnet.

The Hall sensor may be discrete or integrated.

In an advantageous embodiment, there may be provision for the magnetically active region to be in the form of a permanent magnet. Consequently, the magnetically active region can be configured in a simple and cost-effective manner.

Preferably, the permanent magnet is adhesively bonded to the sensor unit retention member, magnetically fitted to the housing or releasably secured.

The permanent magnet may be fitted to the sensor unit retention member at different positions. The different position of the permanent magnet enables an identification of the sensor unit retention member. The identification is linked with a measurement location.

In an advantageous embodiment, there may be provision for a location information item or a position indication to be stored in the magnetically active region. Consequently, an identification can be reliably stored.

In an advantageous embodiment, there may be provision for the location information item or the position indication to be predetermined by means of a positioning of the magnetically active region on the sensor unit retention member. Consequently, numerous location information items or position indications can be depicted and selected.

In an advantageous embodiment, there may be provision for the sensor unit to be able to read the location information or the position indication and to store it in a data store. Consequently, location information or position indications may be able to be linked with other available measurement values.

The location information item or the position indication is preferably a measurement location at which a specific measurement of a parameter, for example, a flow rate or a temperature, takes place.

Preferably, the sensor unit has a data store or memory in which the location information or the position indication can be stored. In addition, measurement values, for example, a measured temperature or a measured pressure, may be able to be stored in the data store.

In an advantageous embodiment, there may be provision for the location information or the position indication and measurement values to be stored in the data store. Consequently, historical measurement values and measurement locations can be retrieved and associated in a simple and rapid manner.

In an advantageous embodiment, there may be provision for another sensor unit retention member to be formed for receiving the sensor unit which differs from the sensor unit retention member in the magnetically active region. Consequently, a location information item or position indication can be encoded and stored in a simple and reliable manner in the magnetically active region.

In an advantageous embodiment, there may be provision for the sensor unit to have a measurement sensor which is separate from the magnetic field sensor. Consequently, the sensor unit can measure a plurality of measurement values at the same time.

In an advantageous embodiment, there may be provision for the sensor unit to have an input unit and a display unit. Preferably, the input unit may be characterized by buttons. The input unit may also be in the form of a touchscreen. Preferably, the display unit is in the form of a display. Consequently, a user can activate inputs into the sensor unit in a reliable and rapid manner and at the same time keep track of the display of a measurement value.

In order to achieve the objective mentioned, the features of the subsidiary claim which is based on a method for recording measurement values are provided according to the invention. In particular in order to achieve the objective mentioned, it is consequently proposed according to the invention in a method of the type mentioned in the introduction that during receiving a position of a magnetically active region on the sensor unit retention member is detected and that an information item corresponding to the position is stored with the measurement values. Consequently, an automatic information item relating to the measurement location is provided in connection with an information item relating to the measurement value.

In an advantageous embodiment, there may be provision for the sensor unit for recording additional measurement values to be secured to another sensor unit retention member, the magnetically active region of which is constructed differently from that of the sensor unit retention member. Consequently, different measurement locations can be automatically provided.

The advantage of the invention is the automatic and secure association of measurement values with the measurement location under changing and non-stationary conditions.

BRIEF DESCRIPTION OF THE DRAWINGS

The invention will now be described in greater detail with reference to one embodiment, but is not limited to this embodiment. Other embodiments will be derived by combining the features of individual or a plurality of protective claims with each other and/or with individual or a plurality of features of the embodiment and/or the above-described variants of apparatuses and methods according to the invention.

In the drawings:

FIG. 1 shows a sensor unit and three sensor unit retention members.

DETAILED DESCRIPTION

In the following description of various embodiments of the invention, elements which correspond in terms of their function have corresponding reference numerals even in the case of a differing configuration or shape.

For greater clarity, not all reference numerals are set out in the FIGURES, although the elements may very well be present in the FIGURES. However, identical reference numerals designate functionally and/or structurally identical components and functional units.

FIG. 1 shows a sensor unit 2 and three sensor unit retention members 1. The sensor kit 11 comprises a sensor unit 2 and at least one sensor unit retention member 1.

A sensor unit retention member 1 comprises a vertical securing opening 3, a horizontal securing opening 4 and a magnetically active region 5. The securing openings 3, 4 ensure that the sensor unit retention member 1 can be mounted on a wall or another object. The magnetically active region 5 is preferably in the form of a permanent magnet which is adhesively bonded, magnetically bonded or releasably secured to the sensor unit retention member 1.

The sensor unit retention member 1 may comprise a plastics material. Alternatively, the sensor unit retention member 1 may comprise a metal.

The sensor unit 2 may comprise a plastics material. The sensor unit 2 may also comprise a metal material.

The three sensor unit retention members 1 differ in that the position of the magnetically active region 5 is configured differently. The different positions of the magnetically active regions 5 encode specific and different measurement locations.

The sensor unit 2 comprises a magnetic field sensor 6, an input unit 7, a data store or memory 8, a separate measurement sensor 9 and a display unit 10. Preferably, the magnetic field sensor 6 is in the form of a Hall sensor. The input unit 7 may be in the form of one or more buttons which can, for example, switch the sensor unit 2 on and off. The input unit 7 may also be in the form of a touch screen or display. The sensor unit 2 further has a data store 8. The display unit 10 may be in the form of a display and preferably shows a measured (current) or historical measurement value.

The sensor unit retention member 1 is configured to receive the sensor unit 2 in a defined position and/or orientation.

When the sensor unit 2 is moved close to the sensor unit retention member 1 or is directly suspended, the magnetic field sensor, in particular Hall sensor can read the location information or position indication stored in the magnetically active region 5 of the sensor unit retention member 1 and can store them in the data store 8. In addition, the sensor unit 2 has another separate measurement sensor 9 by which a parameter, such as, for example, a temperature, a pressure or a flow rate can be measured. The parameter is also stored in the data store 8. Consequently, a measurement location information item can be stored and generated automatically and without the intervention of a user.

With a sensor kit 11 having a sensor unit 2 and at least one sensor unit retention member 1, wherein a magnetically active region 5 is formed on the sensor unit retention member 1 and the sensor unit 2 has a magnetic field sensor 6, it is provided that a relative position of the magnetically active region 5 with respect to the sensor unit can be established.

LIST OF REFERENCE NUMERALS

1 Sensor unit retention member
2 Sensor unit
3 Vertical securing opening
4 Horizontal securing opening
5 Magnetically active region
6 Magnetic field sensor
7 Input unit
8 Data store
9 Separate measurement sensor 10 Display unit
11 Sensor kit

The invention claimed is:

1. A sensor kit (11) comprising:
   a sensor unit (2);
   at least one sensor unit retention member (1), wherein a magnetically active region (5) is formed on each said at least one sensor unit retention member (1), wherein the magnetically active region (5) is in the form of a permanent magnet, and wherein the permanent magnet is fitted to the sensor unit retention member (1); and
   the sensor unit (2) includes a magnetic field sensor (6) by which a relative position of the magnetically active region (5) with respect to the sensor unit (2) is established.

2. The sensor kit (11) as claimed in claim 1, wherein the at least one sensor unit retention member (1) is configured to receive the sensor unit (2) in a defined position and/or orientation.

3. The sensor kit (11) as claimed in claim 1, wherein the magnetic field sensor (6) comprises a Hall sensor.

4. The sensor kit (11) as claimed in claim 1, wherein a location information item or a position indication is stored in the magnetically active region (5).

5. The sensor kit (11) as claimed in claim 4, wherein the location information item or the position indication is predetermined by a positioning of the magnetically active region (5) on the at least one sensor unit retention member (1).

6. The sensor kit (11) as claimed in claim 5, wherein the sensor unit (2) is configured to read the location information or the position indication and store the location information or position indication in a data store (8).

7. The sensor kit (11) as claimed in claim 6, wherein the location information item or the position indication and measurement values are stored in the data store (8).

8. The sensor kit (11) as claimed in claim 1, wherein the at least one sensor unit retention member (1) for receiving the sensor unit (2) includes at least first and second sensor unit retention members, and the first sensor unit retention member differs from the second sensor unit retention member in the magnetically active region (5).

9. The sensor kit (11) as claimed in claim 1, wherein the sensor unit (2) has a measurement sensor which is separate from the magnetic field sensor (6).

10. The sensor kit (11) as claimed in claim 1, wherein the sensor unit (2) has an input unit (7) and a display.

11. A method for recording measurement values, the method comprising:
    securing a sensor unit (2) to a sensor unit retention member (1);
    automatically detecting measurement values with the sensor unit (2) in a recurring manner;
    during the securing of the sensor unit (2) to the sensor unit retention member (1), detecting a position of a magnetically active region (5) on the sensor unit retention member (1);
    storing an information item corresponding to the position with the measurement values; and
    securing the sensor unit (2) for recording additional measurement values to a second sensor unit retention member (1), a magnetically active region (5) of the second sensor unit retention member being constructed differently from the magnetically active region (5) of the sensor unit retention member (1).

* * * * *